(12) United States Patent
Gould

(10) Patent No.: US 7,154,968 B2
(45) Date of Patent: Dec. 26, 2006

(54) OPERATING POINT INDEPENDENT DIGITAL AUTOMATIC LEVEL CONTROL

(75) Inventor: Dennis L. Gould, Whittier, CA (US)

(73) Assignee: The Boeing Company, Chicago, IL (US)

( * ) Notice: Subject to any disclaimer, the term of this patent is extended or adjusted under 35 U.S.C. 154(b) by 775 days.

(21) Appl. No.: 10/389,034

(22) Filed: Mar. 14, 2003

(65) Prior Publication Data

US 2004/0179635 A1    Sep. 16, 2004

(51) Int. Cl.
    *H04L 27/08*    (2006.01)
(52) U.S. Cl. ........................... 375/345; 455/234
(58) Field of Classification Search ............. 375/345; 455/234
    See application file for complete search history.

(56) References Cited

U.S. PATENT DOCUMENTS 5,040,194 A * 8/1991 Tjahjadi et al. ............. 375/345

\* cited by examiner

*Primary Examiner*—Chieh M. Fan
*Assistant Examiner*—Jia Lu
(74) *Attorney, Agent, or Firm*—Ostrager Chong Flaherty & Broitman P.C.

(57) ABSTRACT

An automatic level control circuit exhibits a closed loop response that does not change as a function input power operating point. This allows the designer to set the closed loop response and have that response held fixed with respect to input power operating point. The loop response depends solely on the loop error and the loop gain. The loop error is scaled with the iterative loop stress signal.

19 Claims, 1 Drawing Sheet

OPERATING POINT INDEPENDENT DIGITAL AUTOMATIC LEVEL CONTROL

TECHNICAL FIELD

The present invention relates generally to digital systems, and more particularly, to an operating point independent automatic level control system.

BACKGROUND ART

Automatic level control (ALC) circuits are used in systems to reduce signal dynamic range. An automatic level control circuit can take a large input signal dynamic range and reduce it to a constant output power.

The function and construction of amplitude control systems, alternatively known as automatic level control circuits, are well known in the art.

In an automatic level control system, a power detector receives a coupled signal derived from an output signal. The detector generates a feedback signal that is applied to gain control circuitry within the automatic level control system. The gain control circuitry processes this feedback signal to provide an appropriate gain setting that is applied to the input signal such that the output signal is adjusted to an accurately designated power level. The desired output power level is generated even though the input signal applied to the automatic level control circuitry may have a variable amplitude level.

Generally, an automatic level control circuit should have a particular range of reaction time. In other words, there is typically an acceptable range of closed loop response, i.e. reacting too quickly is undesirable, yet reacting too slowly is also undesirable.

Current state of the art digital automatic level control architectures include closed loop response as a function of the input power operating point. This is undesirable because it forces a performance trade between the useable signal dynamic range and the acceptable range of reaction time.

The disadvantages associated with current ALC circuits have made it apparent that a new ALC circuit design is needed. The new design should be generally robust and should not force a performance trade between the useable signal dynamic range and the acceptable range of reaction time according to ALC parameters. The present invention is directed to these ends.

SUMMARY OF THE INVENTION

The present invention provides an automatic level control system, which is operating point independent.

In accordance with one embodiment of the present invention, an automatic level control system, which includes a first multiplier adapted to receive an input signal and an iterative loop stress signal and further adapted to generate therefrom an output signal, is disclosed. A squaring circuit is adapted to receive the output signal and generate therefrom the instantaneous output signal power level measurement.

A second multiplier is adapted to receive the instantaneous output signal power level measurement and a power output control signal and generate therefrom a scaled output power measurement. A first adder is adapted to receive the arithmetic inverse of the scaled output power measurement and a loop threshold signal and generate therefrom a loop error signal. A third multiplier is adapted to receive the loop error signal and the iterative loop stress signal and generate therefrom a compensated loop error signal. A fourth multiplier is adapted to receive the compensated loop error signal and a loop gain setting signal and generate therefrom an accumulator correction signal. An accumulator is adapted to receive the accumulator correction signal and the iterative loop stress signal and generate therefrom a second adder signal. A unit delay is adapted to receive the second adder signal and generate therefrom the iterative loop stress signal.

In accordance with another embodiment of the present invention, an automatic level control method including multiplying a first input and an iterative loop stress is disclosed. An output signal is generated and the instantaneous output signal power measured. The instantaneous output power level and a power output control signal are multiplied. A scaled output power measurement signal is then generated and subtracted from a loop threshold signal the difference is generated and multiplied by the iterative loop stress signal. A compensated loop error signal is generated and the compensated loop error signal and the iterative loop stress signal are multiplied. A accumulator correction signal is generated and the accumulator correction signal and the iterative loop stress signal are added. A second adder signal is generated and integrated and the iterative loop stress signal is generated therefrom.

An advantage of the present invention is that the present architecture allows a designer to set the closed loop response and have that response held fixed with respect to an input power operating point. An additional advantage is that the loop response depends solely on the loop error and the loop gain.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawings, in which.

DETAILED DESCRIPTION OF THE INVENTION

The present invention is illustrated with respect to an operating point independent digital automatic level control system, particularly suited to the aerospace field. The present invention is, however, applicable to various other uses that may require automatic level control, as will be understood by one skilled in the art.

As will be discussed later, one of the primary features of this system is an exhibited closed loop response that does not change as a function input power operating point.

Figure 1:
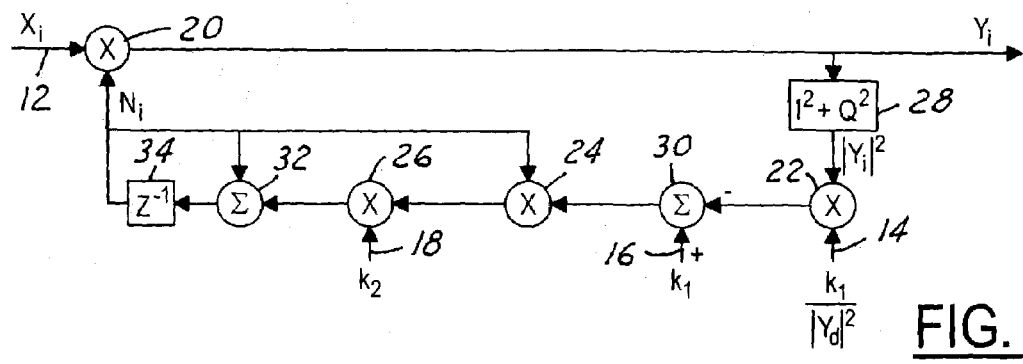
FIG. 1 illustrates an automatic control system in accordance with one embodiment of the present invention.

Referring to FIG. 1, a circuit architecture diagram of the automatic level control system 10 is illustrated in accordance with one embodiment of the present invention The control system 10 includes four inputs 12, 14, 16, 18 (first, second, third and fourth respectively), four multipliers 20, 22, 24, 24 (first, second, third and fourth respectively), at least one squaring circuit 28, two adders 30, 32 (first and second respectively), and a unit delay 34. All of the aforementioned components are well known in the art.

For one embodiment of the present invention, the first multiplier 20 receives the first complex input 12 ($X_i$) and the iterative loop stress ($N_i$) and multiplies the two signals together thereby generating a complex output ($Y_i$). The complex output $Y_i$ equals $N_iX_i$, which is received in the squaring circuit 28. The squaring circuit 28 generates an instantaneous output power level measurement, which is received in the second multiplier 22.

The second multiplier 22 also receives the desired power output control signal (second input 14), and generates therefrom the scaled output power measurement. The first adder 30 receives the scaled output power measurement and a loop threshold signal ($k_1$), i.e. the third input 18, and takes the difference of the two signals, generating therefrom a loop error signal. The loop error signal is received in a third multiplier 24, which also receives the scalar iterative loop stress signal ($N_i$)

The third multiplier 24 multiplies the loop error signal and the scalar iterative loop stress signal and generates therefrom the compensated loop error signal, which is received in the fourth multiplier 26. The third multiplier 24 thereby scales the loop correction such that that the loop response is independent of the operating point.

The fourth multiplier 26 also receives a gain setting ($k_2$) and multiplies the two signals together, therefrom generating an accumulator correction signal. The accumulator correction signal is received in the second adder 32, which also receives the scalar iterative loop stress signal ($N_i$) and adds the two signals together, therefrom generating a second adder signal. The second adder signal is received in the unit delay 34, which integrates the signal and generates therefrom the scaled iterative loop stress signal.

The first input 12, represented by $X_i$, is typically a complex input to the system 10. $N_i$ is a scalar iterative loop stress that multiplies with $X_i$ in the first multiplier, thereby generating $Y_i$ the complex output. $N_i$ is the iterative loop stress and is computed iteratively through the following algorithm:

$$N_{i+1} = N_i \left[ 1 + k_1 k_2 \left( 1 - \frac{|Y_i|^2}{|Y_d|^2} \right) \right],$$

where $Y_i = N_i X_i$, the loop gain $k_1 k_2$ is positive, and $k_1 k_2 \ll 1$.

The iterative loop stress (the output of the loop integrator) is used to scale the loop error signal. This provides compensation for loop dynamics.

The system includes a unique stability point that is a function of the input power and desired output power, unconditional convergence to this stability point, and a loop response independent of this stability point.

Figure 2:
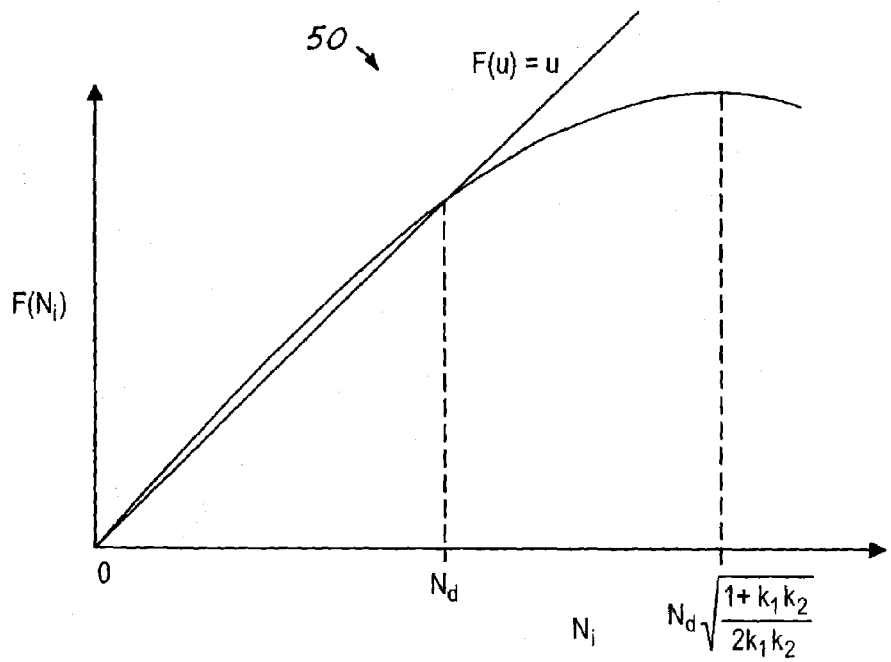
FIG. 2 illustrates a graphical representation of a function of the iterative loop stress in accordance with another embodiment of the present invention.

Referring to FIG. 2 a graphical representation 50 of a stability point diagram, and a function of the iterative loop stress ($F(N_i)$) in the first quadrant, is illustrated. The unique stability point requires that for $N_i$ to be a stability point, $N_{i+1} = N_i$. This is proven through analyzing $N_{i+1}$ for cases in which this equality holds. Let $$N_d = \frac{|Y_d|}{|X_i|}$$

be the desired convergent state of $N_i$. Substituting into $N_{i+1}$, $$N_{i+1} = N_i \left[ 1 + k_1 k_2 \left( 1 - \frac{N_i^2}{N_d^2} \right) \right].$$

Defining $\alpha = 1 + k_1 k_2$ and $$\beta = \frac{k_1 k_2}{N_d^2},$$

$N_{i+1}$ is a function $F(N_i)$, where $F(N_i) = \alpha N_i - \beta N_i^3$.

$F(N_i)$ is stable if and only if $F(u) = u$. $F(N_i)$ intersects the line $F(u) = u$ when $F(N_i) = N_i = \alpha N_i - \beta N_i^3$ then $0 = (\alpha - 1) N_i - \beta N_i^3$, which has roots $N_i = 0$ and $$N_i = \pm \sqrt{\frac{\alpha - 1}{\beta}}.$$

The circuit limits for $N_i > 0$. Therefore the only stability point is:

$$N_i = \sqrt{\frac{\alpha - 1}{\beta}} = \sqrt{\frac{(1 + k_1 k_2 - 1) N_d^2}{k_1 k_2}} = N_d.$$

The only stability point for the system is $N_i = N_d$, which is the only desired stability point by definition.

Figure 3:
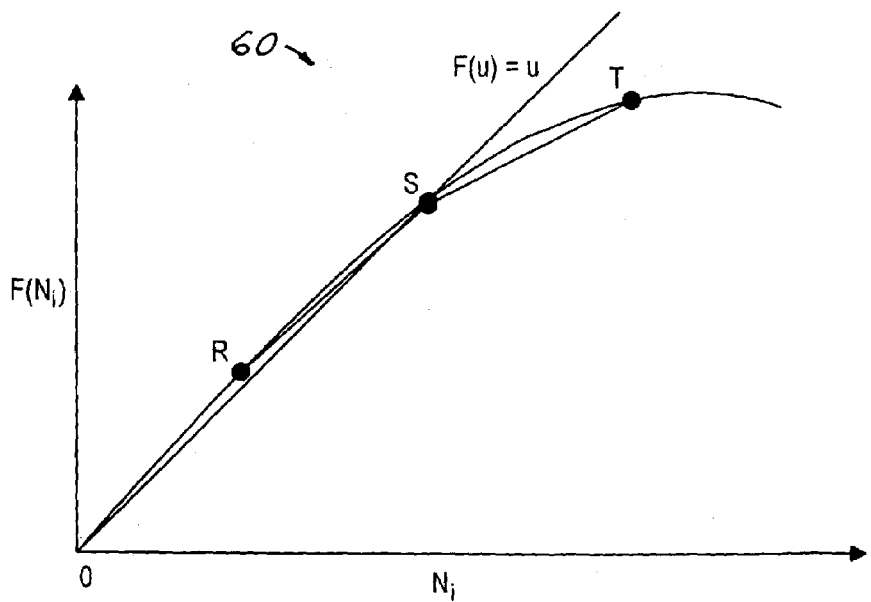
FIG. 3 illustrates a slope of the function of the iterative loop stress of FIG. 2 around the stable point.

Referring to FIG. 3, a graphical representation 60 of the slope of $F(N_i)$ about the stable point is illustrated. The roots of $F(N_i)$ are $N_i = 0$ and $$N_i = \pm \sqrt{\frac{\alpha}{\beta}}.$$

The derivative of $F(N_i)$ with respect to $N_i$ is:

$$\frac{\delta F(N_i)}{\delta N_i} = F'(N_i) = \alpha - 2\beta N_i^2,$$

where $F'(0) = \alpha$, which is positive and independent of $N_d$. $F(N_i)$ is a third order polynomial with positive slope at the origin and one positive root. Therefore, there is exactly one local maximum in the first quadrant. The slope at the origin, $F'(0)>1$. The local maximum occurs at:

$$F'(N_i)=0=\alpha-\beta N_i^2,$$

which has one positive root at:

$$N_i = \sqrt{\frac{\alpha}{2\beta}} = N_d\sqrt{\frac{\alpha}{2(\alpha-1)}} = N_d\sqrt{\frac{1+k_1k_2}{2k_1k_2}}.$$

The slope of $F(N_i)$ at the intersection is:

$$F'(N_d) = \alpha - 2\beta N_d^2 = 1 + k_1k_2 - 2\frac{k_1k_2}{N_d^2}N_d^2 = 1 - k_1k_2.$$

The slope of $F(N_i)$ at the intersection is less than one and independent of $N_d$. The curve is concave down and monotonic for all points (T) from the intersection to the local maximum. The slope of the chord $\overline{ST}$ in FIG. 3 is positive and less than 1 for all T. The slope of all chords $\overline{RS}$ in FIG. 3 is a maximum as R approaches the origin and is positive and less than one for all R except at the origin, where the slope equals one.

Therefore, for all points, $$\left(0, N_d\sqrt{\frac{1-k_1k_2}{2k_1k_2}}\right),$$

$F(N_i)$ meets Lipschitz criteria with L<1, as will be understood by one skilled in the art. $F(N_i)$ is resultantly convergent for all points $$\left(0, N_d\sqrt{\frac{1-k_1k_2}{2k_1k_2}}\right).$$

The range of convergence scales with $N_d$, however, the convergence is independent of $N_d$.

$F(N_i)$ has an upper bound imposed by the finite precision in the system. For small $k_1k_2$, the local maximum is much greater than the intersection.

The circuit can limit operation to:

$$\left(0, N_d\sqrt{\frac{1-k_1k_2}{2k_1k_2}}\right)$$

without significant reduction in flexibility.

The independent loop response is proven through the following:

$$\text{let } \Delta \equiv 20\log\left(\frac{N_{i+1}}{N_i}\right), \text{ and } \delta \equiv \frac{N_i}{N_d}.$$

For a step change in $N_d$ of $20*\log(\delta)$ dB, the correction ($\Delta$) in dB depends on $\delta$ and is independent of $N_d$. This is proven as follows:

$$N_{i+1} = N_i\left[1 + k_1k_2\left(1 - \frac{N_i^2}{N_d^2}\right)\right], \text{ and}$$

$$\frac{N_{i+1}}{N_i} = 1 + k_1k_2\left(1 - \frac{N_i^2}{N_d^2}\right).$$

Substituting, $$20\log\left(\frac{N_{i+1}}{N_i}\right) = 20\log[1 + k_1k_2(1-\delta)],$$

and $$\Delta = 20\log[1+k_1k_2(1-\delta)].$$

Therefore, the current correction ($\Delta$) depends on $\delta$ and $k_1k_2$ and not on $N_d$.

The system includes a unique stability point that is a function of the input power and desired output power, unconditional convergence to this stability point, and a loop response independent of this stability point. This system allows designers to set the closed loop response and have that response held fixed with respect to the input power operating point because the loop response depends solely on the loop error and the loop gain.

One skilled in the art will realize that the present invention has numerous applications and can be included as part of a larger control system or as a stand alone automatic level controller.

In operation, the automatic level control method includes multiplying a first input and an iterative loop stress signal. An output signal is generated, and the instantaneous output signal power is measured. The instantaneous output power level and a power output control signal are multiplied. A scaled output power measurement signal is then generated and subtracted from a loop threshold signal. The difference is generated and multiplied by the iterative loop stress signal. A compensated loop error signal is generated and the compensated loop error signal and the iterative loop stress signal are multiplied. An accumulator correction signal is generated and the accumulator correction signal and the iterative loop stress signal are added. A second adder signal is generated and integrated and the iterative loop stress signal is generated therefrom.

From the foregoing it can be seen that there has been brought to the art a new and improved automatic level control system. It is to be understood that the preceding description of the preferred embodiment is merely illustrative of some of the many specific embodiments that represent applications of the principles of the present invention. Clearly, numerous and other arrangements would be evident to those skilled in the art without departing from the scope of the invention as defined by the following claims.

What is claimed is:

1. An automatic level control system comprising:
   a first multiplier adapted to receive an input signal and a loop stress signal and further adapted to generate therefrom an output signal;
   a squaring circuit adapted to measure instantaneous output signal power from said output signal;

a second multiplier adapted to receive said instantaneous output signal power and a power output control signal and generate therefrom a scaled output power measurement signal;

a first adder adapted to receive an arithmetic inverse of said scaled output power measurement signal and a first loop threshold signal and generate therefrom a loop error signal;

a third multiplier adapted to receive said loop error signal and said loop stress signal and generate therefrom a compensated loop error signal;

a fourth multiplier adapted to receive said compensated loop error signal and a system parameter signal and generate therefrom an accumulator correction signal;

a second adder adapted to receive said accumulator correction signal and said loop stress signal and generate therefrom a second adder signal; and a unit delay adapted to receive said second adder signal and generate therefrom said loop stress signal.

2. The automatic level control system of claim 1 further comprising:

a unique stability point that is a function of an input power and a desired output power, wherein signals within the system unconditionally convergence to said stability point, and wherein a loop response is independent of said stability point.

3. The automatic level control system of claim 1 wherein said input signal is a complex input signal.

4. An automatic level control method comprising:

multiplying a first input and a loop stress signal and generating therefrom an output signal;

squaring said output signal and generating therefrom an instantaneous output signal power measurement;

multiplying said instantaneous output signal power measurement and a power output control signal and generating therefrom a scaled output power measurement signal;

subtracting said scaled output power measurement signal from a loop threshold signal and generating therefrom a loop error signal;

multiplying said loop error signal and said loop stress signal and generating therefrom a compensated loop error signal;

multiplying said compensated loop error signal and a system parameter signal and generating therefrom an accumulator correction signal;

adding said accumulator correction signal and said loop stress signal and generating therefrom a second adder signal;

integrating said second adder signal; and generating therefrom said loop stress signal.

5. The automatic level control method of claim 4 further comprising receiving the first input and the loop stress signal in a first multiplier.

6. The automatic level control method of claim 4 further comprising:

receiving said output signal in a squaring circuit; and normalizing said output signal.

7. The automatic level control method of claim 4 further comprising receiving said instantaneous output signal power measurement and the power output control signal in a second multiplier.

8. The automatic level control method of claim 4 further comprising receiving said scaled output power measurement signal and the loop threshold signal in a first adder.

9. The automatic level control method of claim 4 further comprising receiving said loop error and said loop stress signal in a third multiplier.

10. The automatic level control method of claim 4 further comprising receiving said compensated loop error signal and the system parameter signal in a fourth multiplier.

11. The automatic level control method of claim 4 further comprising receiving said accumulator correction signal and said loop stress signal in a second adder.

12. The automatic level control method of claim 4 further comprising receiving said second adder signal in a unit delay thereby generating said loop stress signal.

13. The method of claim 4 further comprising generating a unique stability point that is a function of an input power and a desired output power.

14. The method of claim 13 further comprising generating an unconditional convergence to said stability point.

15. The method of claim 13 further comprising generating a loop response independent of said stability point.

16. An automatic level control method comprising:

receiving a first input and an iterative loop stress signal in a first multiplier;

multiplying said first input and said iterative loop stress signal and generating therefrom an output signal;

receiving said output signal in a squaring circuit;

normalizing said output signal and generating therefrom a normalized output signal;

receiving said normalized signal and a power output control signal in a second multiplier and generating therefrom a scaled output power measurement signal;

receiving said scaled output power measurement signal and a loop threshold signal in a first adder and generating therefrom a loop error signal;

receiving said loop error signal and said iterative loop stress signal in a third multiplier and generating therefrom a compensated loop error signal;

receiving said compensated loop error signal and a system parameter signal in a fourth multiplier and generating therefrom an accumulator correction signal;

receiving said accumulator correction signal and said iterative loop stress signal in the second adder and generating therefrom a second adder signal;

receiving said second adder signal in a unit delay; and generating therefrom said iterative loop stress signal.

17. The method of claim 16 further comprising generating a unique stability point that is a function of an input power and a desired output power.

18. The method of claim 17 further comprising generating an unconditional convergence to said stability point.

19. The method of claim 17 further comprising generating a loop response independent of said stability point.

* * * * *